(12) United States Patent
Popovich

(10) Patent No.: US 7,956,278 B1
(45) Date of Patent: *Jun. 7, 2011

(54) SOLAR HEAT TRANSFER APPARATUS

(75) Inventor: John M. Popovich, Solana Beach, CA (US)

(73) Assignee: Onscreen Technologies, Inc., Portland, OR (US)

( * ) Notice: Subject to any disclaimer, the term of this patent is extended or adjusted under 35 U.S.C. 154(b) by 354 days.

This patent is subject to a terminal disclaimer.

(21) Appl. No.: 11/821,501

(22) Filed: Jun. 25, 2007

Related U.S. Application Data

(60) Provisional application No. 60/918,449, filed on Mar. 15, 2007.

(51) Int. Cl.
*H01L 31/024* (2006.01)
(52) U.S. Cl. ..................... 136/246; 136/259
(58) Field of Classification Search ............. 165/104.33, 165/48.2, 49, 56, 170, 180; 136/243–465; 438/57–98; 126/634
See application file for complete search history.

(56) References Cited

U.S. PATENT DOCUMENTS

| | | | | |
|---|---|---|---|---|
| 902,812 | A | * | 11/1908 | Goetz et al. ................... 426/521 |
| 2,946,945 | A | * | 7/1960 | Regnier et al. ................ 320/101 |
| 3,976,508 | A | * | 8/1976 | Mlavsky ....................... 136/246 |
| 3,983,861 | A | * | 10/1976 | Beauchaine .................. 126/656 |
| 4,002,031 | A | * | 1/1977 | Bell ........................... 60/641.15 |
| 4,320,246 | A | * | 3/1982 | Russell ......................... 136/248 |
| 4,403,653 | A | * | 9/1983 | Davidson ..................... 165/170 |
| 5,049,855 | A | | 9/1991 | Slemon et al. |
| 5,719,444 | A | * | 2/1998 | Tilton et al. ................... 257/714 |
| 6,215,464 | B1 | | 4/2001 | Jensen |
| 7,219,715 | B2 | | 5/2007 | Popovich |
| 2004/0125515 | A1 | | 7/2004 | Popovich |

* cited by examiner

*Primary Examiner* — Basia Ridley
*Assistant Examiner* — Christina Chern
(74) *Attorney, Agent, or Firm* — William W. Haefliger

(57) ABSTRACT

Heat transfer apparatus comprising, in combination inner and outer bodies defining a space therebetween which extends at least part way about an axis, at least one of the bodies being heat conductive, a heat conductive woven mesh extending in the space at least part way about the axis, and in heat transfer relation with at least one of the bodies, fluid in the space in heat transfer contact with the mesh, and solar cells carried by the outer body.

10 Claims, 7 Drawing Sheets

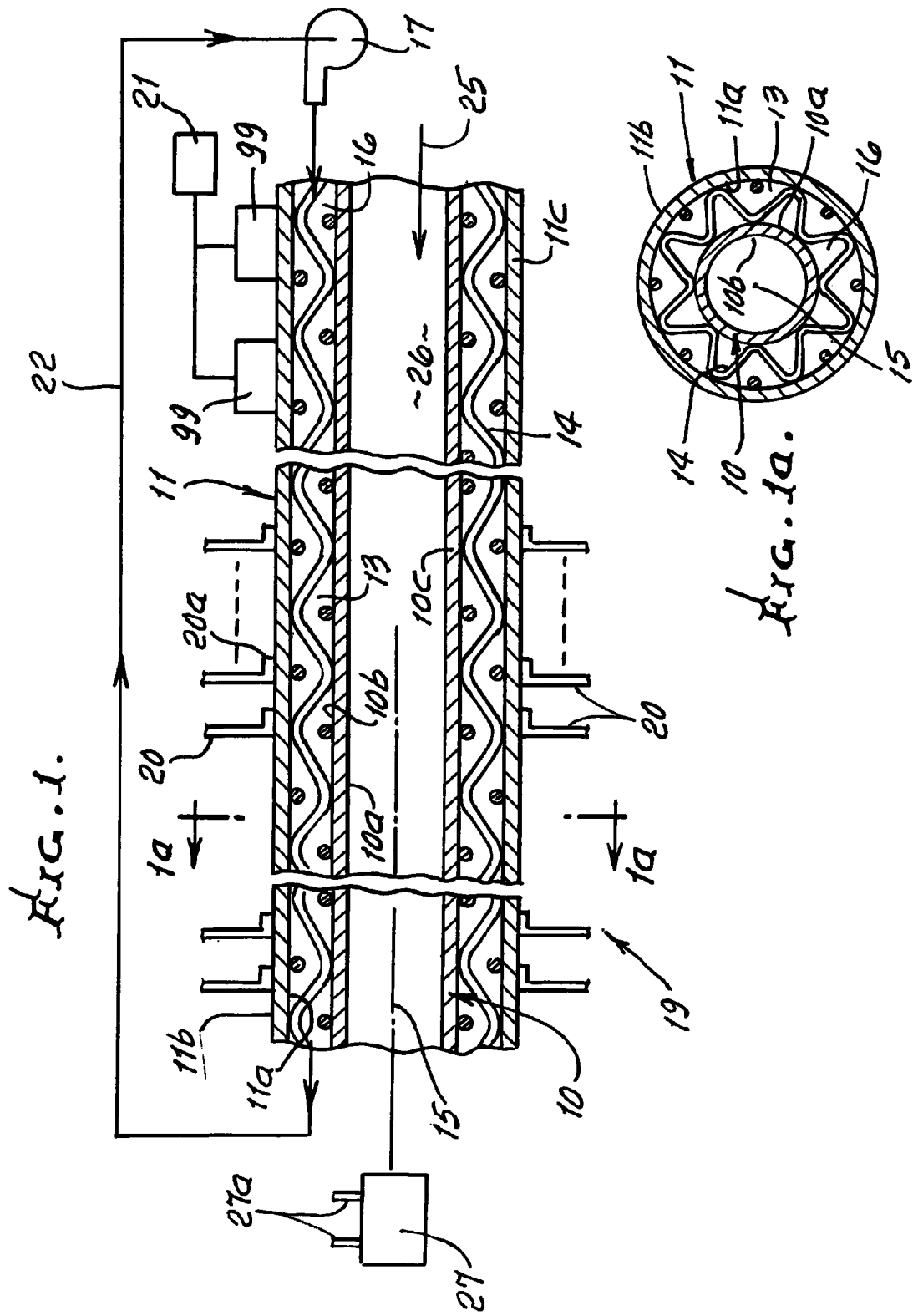

SOLAR HEAT TRANSFER APPARATUS

This application is based on provisional application Ser. No. 60/918,449, filed Mar. 15, 2007 entitled "Concentric Tube Heat Spreader".

BACKGROUND OF THE INVENTION

This invention relates generally to high rate heat transport, and more specifically to such heat transport employing heat conductive woven mesh in a fluid flow path that extends about an axis, enabling highly efficient cooling of heat generating devices.

The lifetime and efficiency of electronic devices and systems degrade strongly with increasing temperature. Means to transport heat from the electronic devices and systems to the local environment more effectively would allow operation of electronic devices at higher power density and thereby offer potential reductions in cost, mass, and volume.

There is need for such means, as exemplified by the apparatus and its operation, producing unusual results, as disclosed herein.

SUMMARY OF THE INVENTION

It is a major object of the invention to provide highly compact, and highly efficient, low cost, high rate solar cell heat transport apparatus, and characterized by:

a) inner and outer bodies defining a space therebetween which extends at least part way about an axis, at least one of the bodies being heat conductive, b) a heat conductive woven mesh extending in said space at least part way about said axis, and in heat transfer relation with at least one of the bodies, c) and fluid in said space in heat transfer contact with said mesh.

Another object is to provide for low cost high rate heat transport via a coaxial tube arrangement that creates a pressure vessel with an elongate annular chamber containing a microchannel array and fluid or fluids that undergo evaporation near heat sources placed on or near regions on the outside and/or inside of the vessel and condensation in regions remote from the heat sources.

A further object is to provide a heat transport vessel that includes metal tubes with a woven metal mesh therebetween. The metal mesh serves to maintain a space between the vessel's inner and outer tubes, and acts as an extended surface for increased thermal conductivity between the fluid and the tubes between the inner and outer tubes, the mesh also providing increased area for evaporation regions. In addition, the tube surfaces adjoining or adjacent the mesh may have surface modification such as contra-helical grooves and/or abraded surfaces inter alia to enhance heat transport. Usable materials include aluminum and copper for the tubes, meshes, and extended surfaces, and hydrocarbons, fluorocarbons, and water based mixtures for working fluids. Aluminum and propane represent a cost effective combination of materials.

Yet another object is to provide a mesh filled annular fluid chamber that creates a microchannel array in which local forces such as capillarity dominate the fluid action, the system being less sensitive to gravitational and inertial forces than a cylindrical chamber heat pipe.

An additional object is to provide a generally horizontally oriented heat spreader useful in a number of applications, including semiconductor illuminators and concentrating photovoltaic arrays as depicted herein.

An added object is to provide an improved heat pipe that overcomes difficulties encountered in heat pipe use, such as difficulty in ensuring exactly horizontal orientation. A heat pipe slightly inclined from the horizontal accumulates liquid in the lower end reducing effectiveness for heat sources in regions distant from the lower end. In dynamic environments the liquid may slosh from end to end and prevent consistent operation and additionally cause an increase in mechanical stress and strain of neighboring components. The present invention overcomes these problems by confining the operating fluids to a microchannel array as in a mesh where the fluids are more affected by local forces than gravitational and inertial forces, and thus facilitate heat source placement anywhere along the length of the vessel to have consistent operation.

Fluid motion in the apparatus of the present invention may be completely or partly annular as in the case of a line like elongated heat source, and provide consistent operation along its length; or provide for both annular and axial fluid motion as in the case of discrete heat sources along its length. The vessel may have extended surfaces formed or attached for increased air side or external heat transport and these may take the form of annular metal discs or helicoids. Also, the consolidated tube/mesh/tube combination provides a useful structural product in its own right. It provides higher stiffness/mass than a comparably sized solid tube and may be used as the primary structural element in many applications. The interior or innermost region of the vessel may be used for purposes including air flow cooling and power conversion system placement.

These and other objects and advantages of the invention, as well as the details of an illustrative embodiment, will be more fully understood from the following specification and drawings, in which:

DRAWING DESCRIPTION

FIG. 1 is a cross-section showing one form of the invention;

FIG. 1a is a section taken on lines 1a-1a of FIG. 1;

DETAILED DESCRIPTION

Figure 1B:
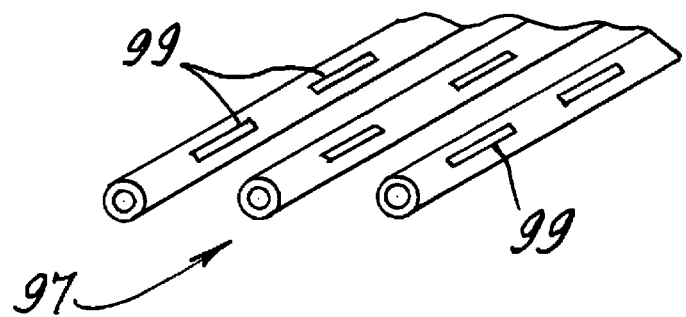
FIG. 1b is a portion of an array of tubes and solar cells.

Referring first to FIGS. 1 and 1a, inner and outer bodies, as for example tubes 10 and 11 extend coaxially. Body 10 has inner and outer cylindrical surfaces 10a and 10b, and body 11 has inner and outer surfaces 11a and 11b. The bodies define space 13 therebetween which is annular. At least one of the bodies is heat conductive, for example metallic, or preferably both are metallic.

Heat conductive woven metallic mesh 14 extends in space 13, at least part way about axis 15, and extending in heat transfer relation with at least one of the bodies. For example, the mesh may contact outer surface 10b of body 10, and/or inner surface 11a of body 11, whereby heat is conducted to the mesh via one or both bodies 10 and 11. The mesh in turn transfers heat to fluid 16 in space 13, and typically flowing axially in that space, through the interstices of the mesh woven wires or strands.

A heat generating electrical circuit element or elements, such as solar cells, is or are provided, and as are shown at 99 on or in contact with tube 11 outer surface 11b, so that generated heat flows inwardly through the tube wall 11c and into the mesh in contact with inner wall 11a; in well as into fluid 16. The thus heated fluid, such as liquid or gas, may be caused to flow axially in space 13, as by pumping at 17, to flow to a heat dissipation zone; and then return to pump 17, via path 22, for re-circulation through the mesh. One such heat dissipation zone is indicated at 19, and may include fins 20 contacting or mounted at 20a on outer tube extent 11b separate from the circuit elements 99. The latter may comprise solar cells. The cells may be provided in an array, one-dimensional or multi-dimensional. An electrical control to control ON-OFF status of the elements 99 is indicated at 21. Multiple sets of tubes 10 and 11 may be arrayed, to display the elements in an overall array. See FIG. 1b array 97. Fluid may be evaporated by heat input at the mesh, and condensed at zone 19, to remove heat.

Alternate or supplemental heat dissipation or cooling may be provided by fluid 25 flow, axially, within the interior 26 of inner tube 10. Heat transfers to such fluid via the mesh and the wall 10c of the inner tube. That fluid 25 flows to the exterior and to heat dissipation zone 27, which may also be provided with heat dissipating fins 27a.

Figure 2:
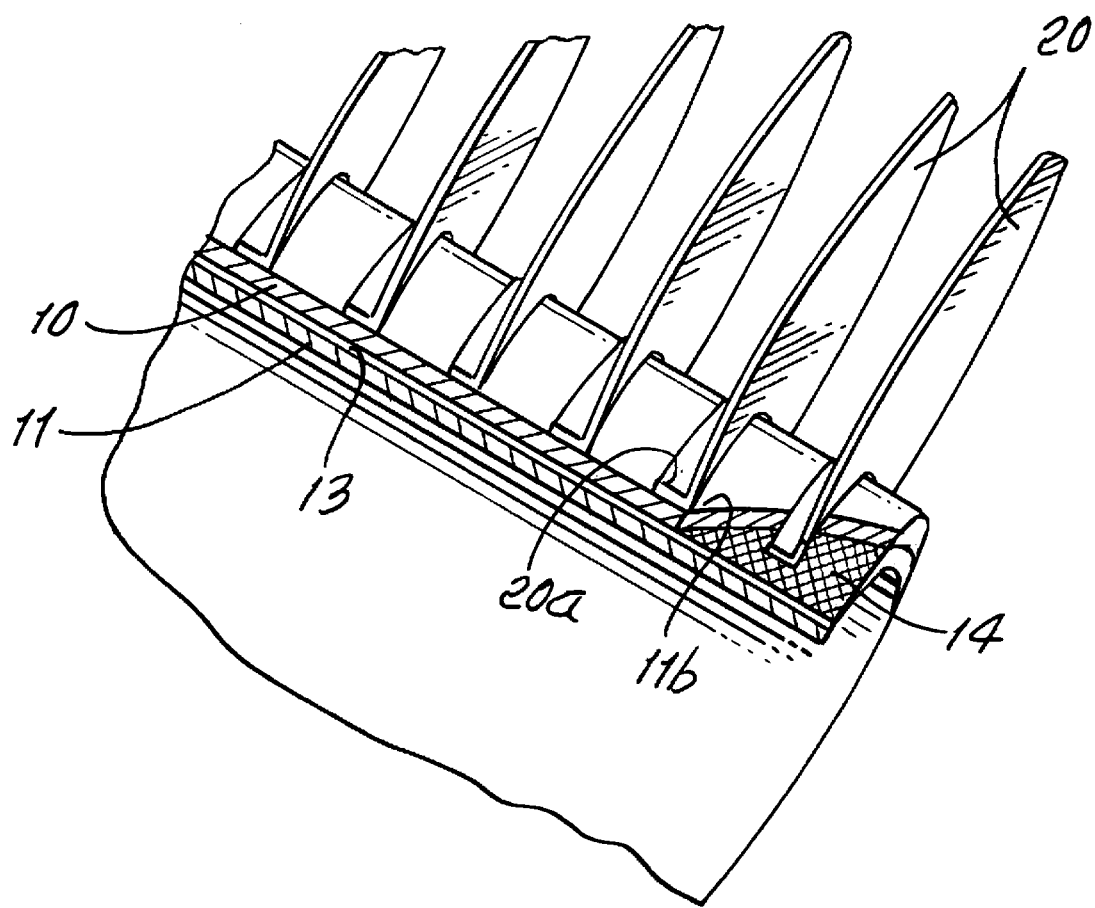
FIG. 2 is a perspective view showing another form of the invention.
Figure 3:
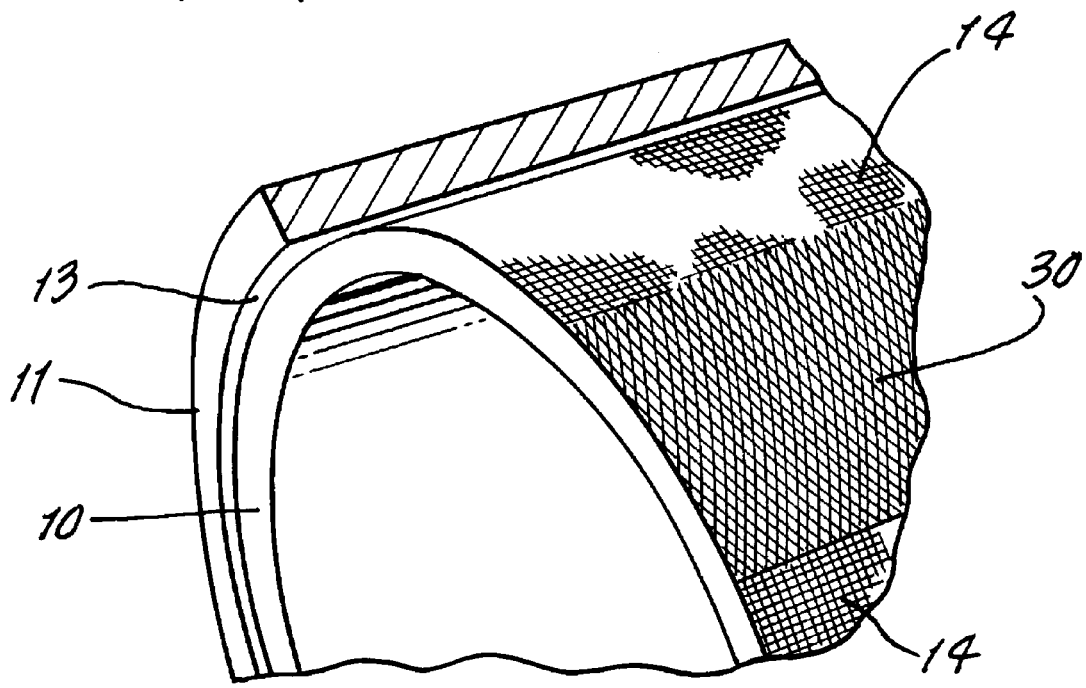
FIG. 3 is a perspective view showing a further modified form of the invention.

FIG. 2 illustrates a particular construction of the device elements which bear the same identifying numerals. FIG. 3 likewise bears the same numerals; however, the outer wall 10b of the inner tube 10 is grooved as at 30, whereby heat transfer via the groove wall, to or from the fluid in space 13, is enhanced by that groove wall, producing edge break-up of laminar flow, to produce turbulent flow. Contra-helical criss-crossing of grooves is preferred.

Figure 4:
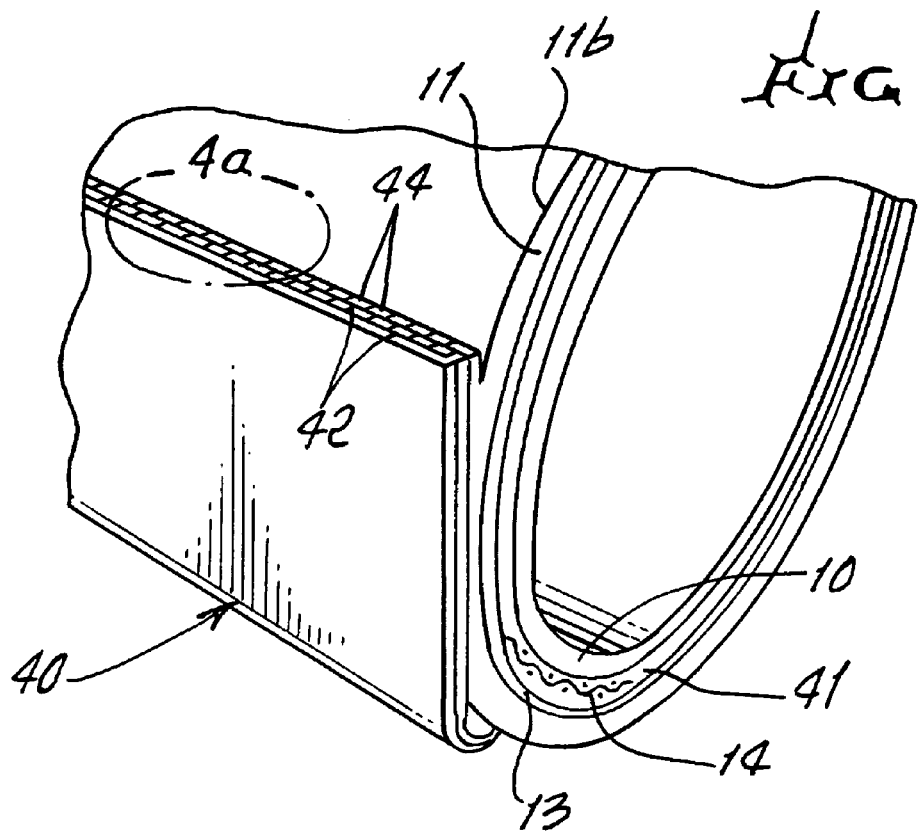
FIG. 4 is a perspective view showing an additional form of the invention.
Figure 4A:
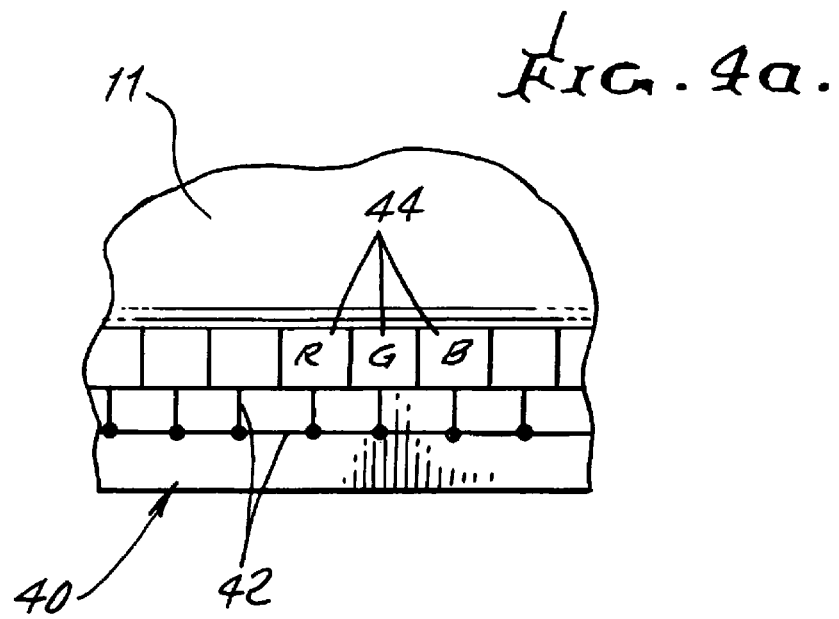
FIG. 4a is an enlarged view taken on line 4a seen in FIG. 4.
Figure 5:
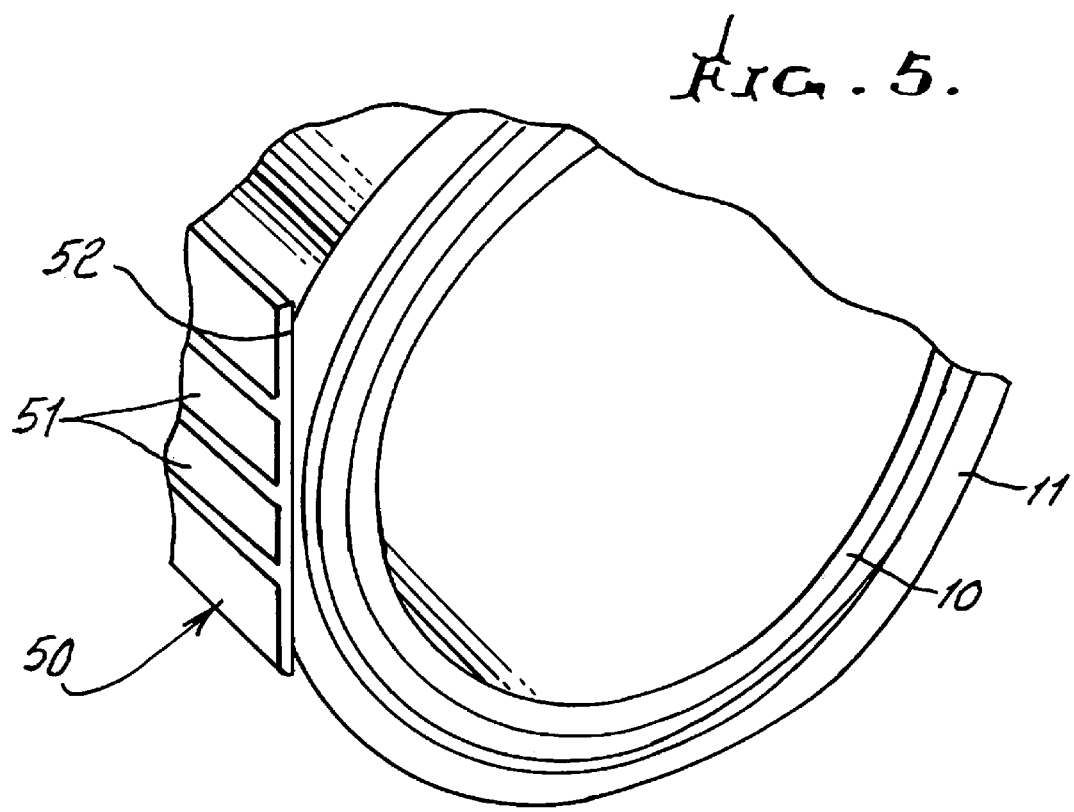
FIG. 5 is a perspective view showing yet another form of the invention.

FIG. 4 is similar to FIG. 2; however, a heat conductive plate or sheet 40 is integral with or in contact with the outer tube outer wall 11b. Solar cells 44 mounted on that plate 40 transfer heat by conduction to the plate, and such heat is then widely transferred by conduction, widely via the plate and to the mesh and fluid in space 13. That space may be closed at the end of the tubing, as by an end seal 41, soldered or brazed in position. Solar cell circuit wires are indicated at 42, in plate 40, for supply of general electrical current from an array of such cells. The plate may consist of copper, for example. See Also FIG. 4a. FIG. 5 shows a metallic laminate circuit board 50 for mounting of solar cells, power conversion elements and or control elements, as at 51. Board 50 is suitably attached at 52 to the outer tube 11, i.e. by soldering, welding or brazing.

Figure 6:
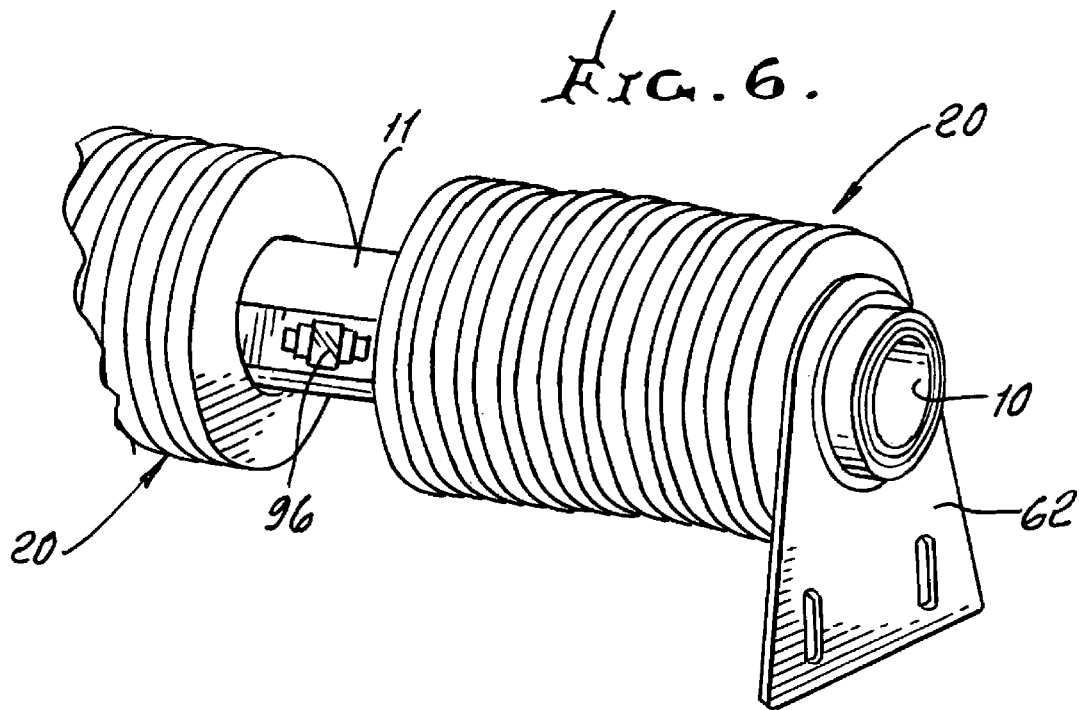
FIG. 6 is a perspective view showing a tube mounting means.
Figure 7:
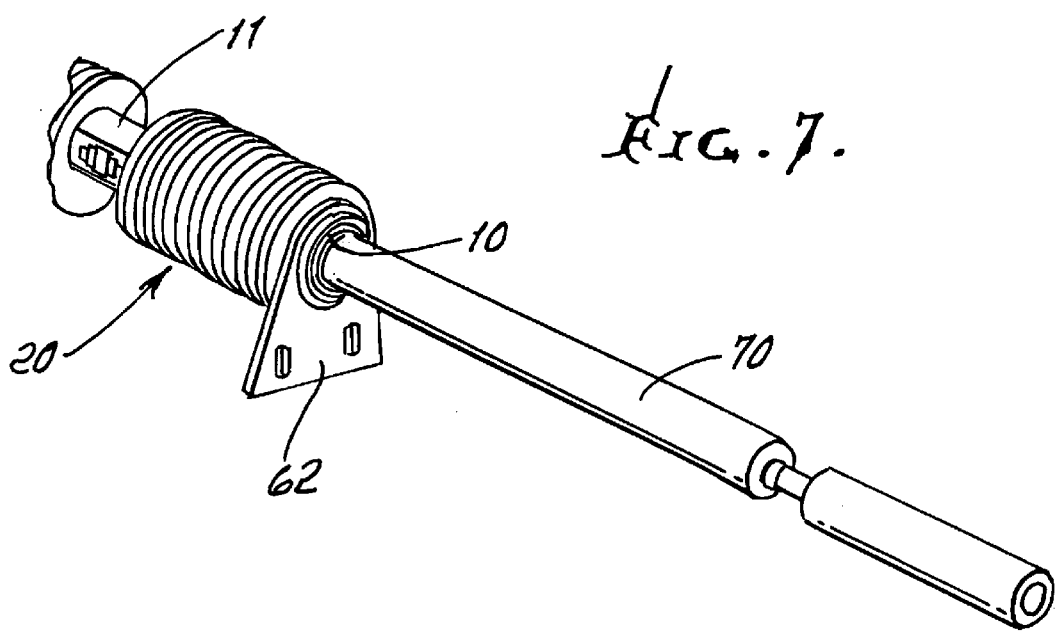
FIGS. 7 and 8 are perspective views showing mass damping elements in the interior of tubular apparatus of the invention.
Figure 8:
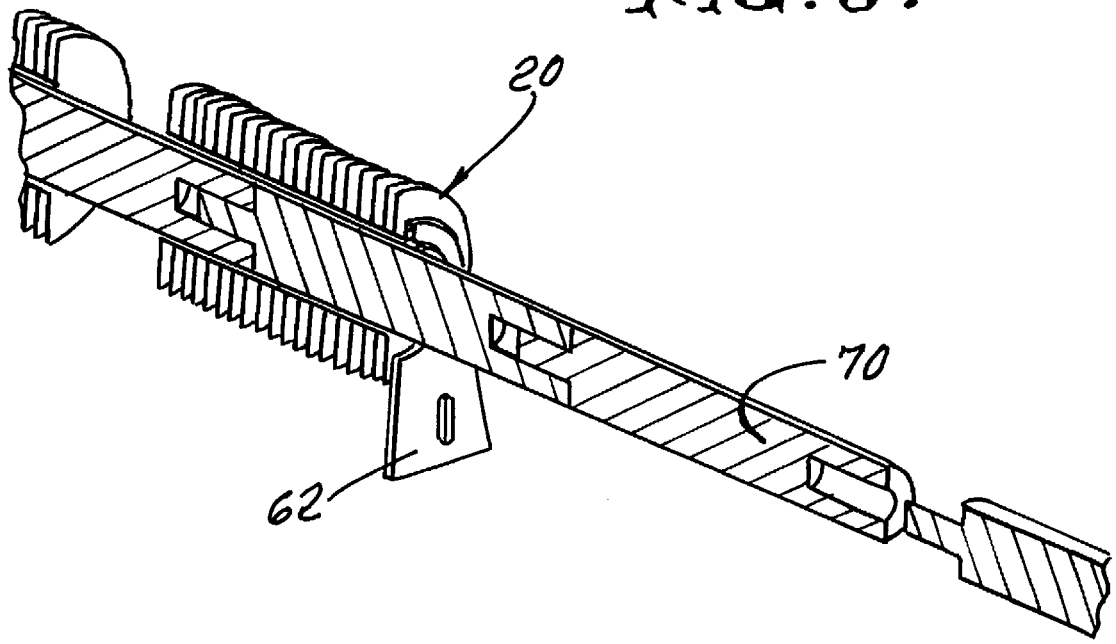
Figure 9:
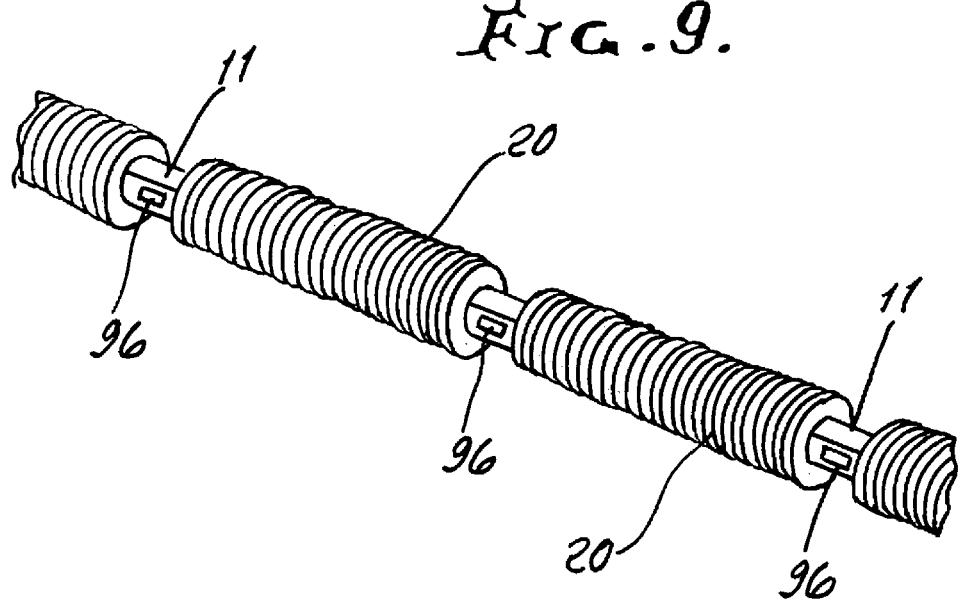
FIGS. 9 and 10 are views showing employment of photovoltaic cells.
Figure 10:
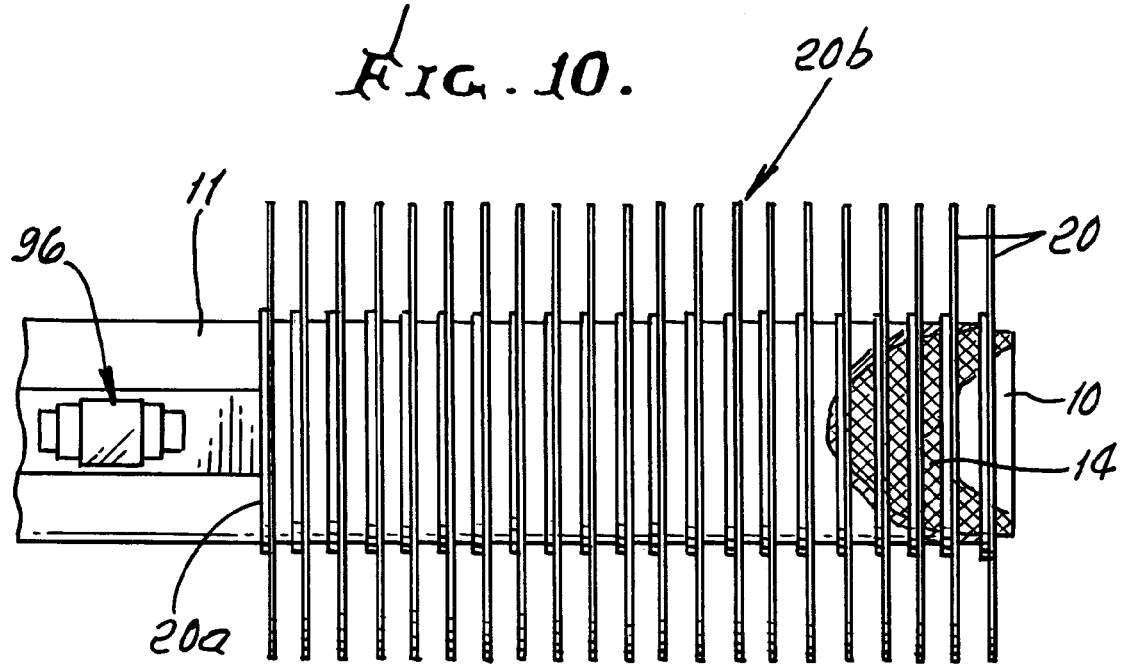
Figure 11:
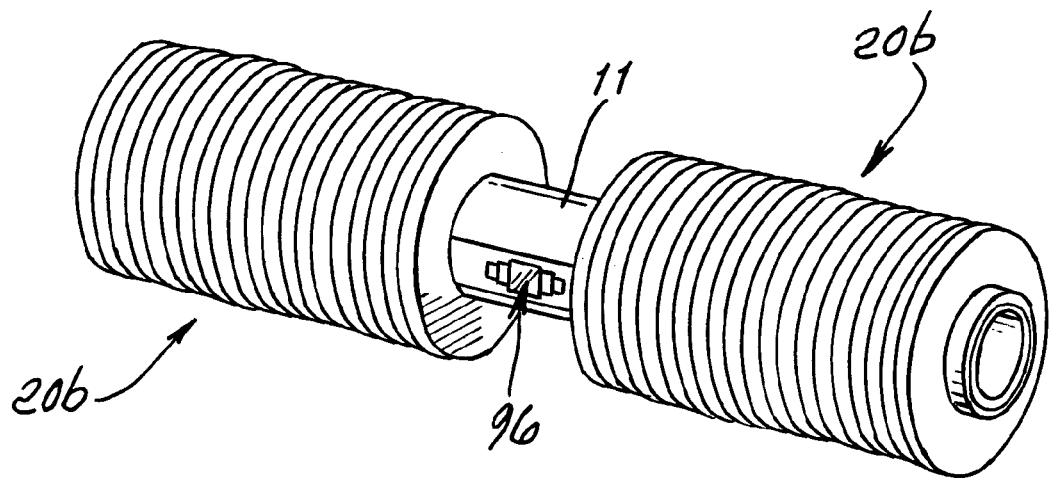
FIG. 11 is a perspective view showing use of an extended surface cooling fin array on tubular apparatus of the invention.

FIGS. 6-8 show a cylindrical mass damping element 70 extending within the bore of the inner tube 10, and an end mounting bracket 62. FIGS. 9-11 show similar elements, and also a photovoltaic cell or cells 96 mounted on the outer tube 11, between clusters 20a of heat dissipating fins. The cell or cells 96 are usable to control ON-OFF condition of the solar cells carried as described above.

I claim:

1. Heat transfer apparatus comprising, in combination:
   a) inner and outer bodies defining an axially extending annular space therebetween which extends at least part way about said axis, at least one of the bodies being heat conductive,
   b) a heat conductive woven mesh extending axially and annularly in said space at least part way about said axis, and in heat transfer relation with at least one of the bodies, the mesh also extending crosswise of said space to contact annular surfaces defined by said inner and outer bodies, along axial length of said mesh, said surfaces at locations facing and contacting the mesh along their lengths being free of indentations, the mesh confined between said annular surfaces and being separate from said bodies,
   c) and fluid in said space flowing axially and through the mesh between spaced apart mesh wires in heat transfer contact with said mesh, along the mesh length that extends about said axis,
   d) and solar cells carried by the outer body in heat transfer relation therewith,
   e) there also being heat dissipating means on the outer body and to which said heat is transferred for dissipation, and wherein said means includes fins on said outer body dissipating heat to gas adjacent or near the fins, said solar cells and fins axially spaced apart from one another on the outer body.

2. The combination of claim 1 including an electrical device producing heat which is transferred via said mesh for dissipation.

3. The combination of claim 1 wherein said fluid is liquid.

4. The combination of claim 1 wherein said bodies are generally tubular and coaxial, to define said axis.

5. The combination of claim 1 including a metallic circuit support on the outer body, for carrying at least one of the following
   i) power conversion circuitry
   ii) control circuitry.

6. The combination of claim 1 wherein the inner body is tubular and defines a bore, and including mass damping means located in said bore.

7. The combination of claim 6 wherein said mass damping means includes cylindrical segments located at selected positions axially, in the bore.

8. The combination of claim 1 including at least one photovoltaic cell carried by the outer body at the exterior thereof.

9. The combination of claim 1 including means for dissipating heat flowing from the mesh to the inner body.

10. The combination of claim 9 wherein said means include a second fluid flowing within the inner body and receiving heat transferred from the mesh to the inner body and then to the second fluid.

* * * * *